United States Patent
Kazui et al.

(10) Patent No.: US 6,406,357 B1
(45) Date of Patent: Jun. 18, 2002

(54) GRINDING METHOD, SEMICONDUCTOR DEVICE AND METHOD OF MANUFACTURING SEMICONDUCTOR DEVICE

(75) Inventors: Shinichi Kazui; Kazuo Shirase, both of Hadano; Kenji Morita, Tokyo; Hideaki Sasaki, Hadano; Hitoshi Odashima, Yokohama, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/522,464

(22) Filed: Mar. 9, 2000

(30) Foreign Application Priority Data

Mar. 10, 1999 (JP) ............................................ 11-063822

(51) Int. Cl.⁷ ................................................ B24B 1/00
(52) U.S. Cl. ........................................ 451/41; 451/287
(58) Field of Search ................................ 451/280, 281, 451/283, 285, 286, 287, 288, 289, 41, 36

(56) References Cited

U.S. PATENT DOCUMENTS

| | | | | |
|---|---|---|---|---|
| 4,276,114 A | * | 6/1981 | Takano et al. | 451/289 |
| 4,882,878 A | * | 11/1989 | Benner | 451/541 |
| 4,956,944 A | * | 9/1990 | Ando et al. | 451/277 |
| 5,125,188 A | * | 6/1992 | Ogawa et al. | 451/343 |
| 5,421,768 A | * | 6/1995 | Fujiwara et al. | 451/283 |
| 5,775,980 A | * | 7/1998 | Sasaki et al. | 451/285 |
| 5,855,735 A | * | 1/1999 | Takada et al. | 451/36 |
| 5,984,765 A | * | 11/1999 | Hashimoto | 451/165 |
| 5,993,300 A | * | 11/1999 | Hashimoto | 451/165 |
| 6,165,056 A | * | 12/2000 | Hayahsi et al. | 451/281 |
| 6,168,499 B1 | * | 1/2001 | Jang | 451/8 |
| 6,200,413 B1 | * | 3/2001 | Privitt et al. | 451/284 |

\* cited by examiner

Primary Examiner—Joseph J. Hail, III
Assistant Examiner—Hadi Shakeri
(74) Attorney, Agent, or Firm—Mattingly, Stanger & Malur, P.C.

(57) ABSTRACT

A surface of a wafer (semiconductor substrate) is subjected to grinding by rotating it and bringing it into contact with a rotating grinding wheel. The grinding wheel is rotated in a first direction at a rotating speed N1. The wafer is rotated in a second direction which is opposite to the first direction at a rotating speed N2, wherein a value of N2/N1 is in the range of 0.006 to 0.025. The wafer is then carried from the grinding process to a dicing process while being maintained in a horizontal position by using a wafer handling jig to prevent the breakage of the wafer. A flash etching process may also be used at the end of the grinding process.

8 Claims, 10 Drawing Sheets

| NO. | ITEMS | COMPARATIVE EXAMPLE 1 | COMPARATIVE EXAMPLE 2 | GRINDING CONDITIONS A | GRINDING CONDITIONS B |
|---|---|---|---|---|---|
| 1 | GRAIN SIZE OF THE ROUGH GRINDING WHEEL | 20~60μm | ↓ | ↓ | ↓ |
| | TYPE OF THE GRINDING WHEEL | VITRIFIED | ↓ | ↓ | ↓ |
| | SPEED OF THE ROUGH GRINDING SPINDLE | 3000RPM | ↓ | ↓ | ↓ |
| | SPEED OF THE WORK TABLE | 200~100RPM | ↓ | ↓ | ↓ |
| | FEED SPEED | 8~3μm m/s | ↓ | ↓ | ↓ |
| 2 | GRAIN SIZE OF THE FINISH GRINDING WHEEL | 4~6μm | 2~4μm | ↓ | ↓ |
| | GRAIN NUMBER | #2000 | #4000 | ↓ | ↓ |
| | TYPE OF THE GRINDING WHEEL | RESINOID | ↓ | ↓ | ↓ |
| | SPEED OF THE FINISH GRINDING SPINDLE (N1) | 3000RPM | ↓ | ↓ | ↓ |
| | PERIPHERAL SPEED | 1850M/MIN | ↓ | 6000RPM 3900m/min | ↓ |
| | SPEED OF THE WORK TABLE (N2) | 150RPM | ↓ | ↓ | 40RPM |
| | N2/N1 | 0.05 | ↓ | 0.025 | 0.006 |
| | FEED SPEED | 0.3μm/s | ↓ | 0.8-0.3μm/s | 0.8-0.3μm/s |
| 3 | MEAN DEFLECTIVE STRENGTH RELATIVE VALUE | 500 | | 850 | 1050 |
| 4 | RESULT | × | × | ○ | ○ |

*FIG. 2*

GRINDING METHOD, SEMICONDUCTOR DEVICE AND METHOD OF MANUFACTURING SEMICONDUCTOR DEVICE

BACKGROUND OF THE INVENTION

The present invention relates to techniques for grinding semiconductor substrates, a semiconductor device, and techniques for manufacturing the semiconductor device. More particularly, the present invention relates to techniques effectively applicable to finishing by grinding a surface of a semiconductor substrate, such as a wafer, to be used for manufacturing semiconductor devices including electronic parts, such as IC chips, applicable to portable information processing apparatus, such as portable telephone sets, mobile personal computers and IC cards, and electronic apparatus.

Semiconductor device manufacturing methods include a grinding process for grinding the back surface of a wafer, i.e., the surface opposite a surface of the wafer in which circuits are formed. This process generally follows a process for forming the circuits using photolithographic techniques and the like prior to subjecting the wafer to a dicing process for dividing the wafer into individual semiconductor devices.

The wafer which is to be subjected to the circuit forming process has a thickness of 500 μm or more to obtain adequate rigidity and strength necessary to withstand external forces that may be exerted thereon in the circuit forming process. Since the circuit functions of semiconductor devices, such as ICs and LSIs, are executed only in a surface layer of a thickness on the order of several micrometers of the wafer, an unnecessary portion of the wafer is removed by grinding to form a semiconductor device which is small, has lightweight construction and conforms to device requirements.

SUMMARY OF THE INVENTION

FIG. 10 shows a flow chart of a grinding method and a method for manufacturing a semiconductor device based on reference technology by way of example. The following analysis of existing technology is a part of the invention, particularly insofar as it relates to the identification or discovery of problems, causes of problems and solutions to problems flowing therefrom. The semiconductor device manufacturing method includes step S1 for forming electronic circuits on a surface A (primary (first) surface in which circuits are to be formed) of a semiconductor substrate (wafer), step S2 for roughly grinding a surface B (back (second) surface) of the wafer for a removable of oxide film and thickness adjustment, step S3 for finish grinding the surface B of the wafer, step S4 for chemical etching the surface B of the wafer with a chemical etchant, and step S5 for dicing the wafer.

Principal conditions for the grinding processes to be carried out in steps S2 and S3 are shown in FIG. 10. Visually recognizable grinding streaks are formed in the surface B of the semiconductor substrate finished by the finish grinding process specified by process conditions shown in FIG. 10. The semiconductor substrate as finished by the finish grinding process in step S3 specified by the conditions shown in FIG. 10 has a low deflective strength described below. Therefore, the surface B is finished by the chemical etching process in step S4 before dicing the semiconductor substrate.

The chemical etching process in step S4 drips or jets an etchant, such as a mixture of hydrofluoric acid and nitric acid, on the surface B of the rotating semiconductor substrate to dissolve the silicon of the semiconductor substrate. The chemical etching process is continued for a long period of time sufficient to etch and finish the semiconductor substrate to a desired thickness.

This grinding technique based on the reference technology requires a substantial chemical etching process for finishing the semiconductor substrate and hence the grinding technique takes more time. For example, the chemical etching process etches the surface B of the semiconductor substrate at an etch rate of about 5 μm/min. Suppose that an etching allowance of 150 μm is left on the semiconductor substrate in step S3. Then, the chemical etching process takes 30 min to finish one semiconductor substrate. When the etching allowance is reduced to reduce time necessary for the chemical etching process in step S3, the strength of the semiconductor substrate is reduced and the possibility of breakage of the semiconductor substrate increases.

Since the chemical etching process uses chemical liquids, such as hydrofluoric acid and nitric acid, liquid waste disposal is costly. It is necessary to provide the process equipment relating to the chemical etching process with chemical corrosion-resisting measures, which increases the manufacturing costs of the process equipment and the running costs.

When a semiconductor substrate is subjected to a chemical etching process, different portions of the semiconductor substrate are etched at different etch rates. Therefore it is difficult to control the thickness of the finished semiconductor substrate. For example, when the semiconductor substrate is finished in a thickness on the order of 30 μm, the differences in thickness between different portions of the semiconductor substrate poses a significant problem.

A semiconductor substrate finished to a thickness on the order of 30 μm by the finish grinding process has a low deflective strength. For example, even a minute flaw in a peripheral portion of the semiconductor substrate could develop into a large crack when it is deflected even slightly during transfer to the dicing process and, eventually, the semiconductor substrate may break.

Accordingly, it is a first object of the present invention to provide a technique capable of reducing the thickness of a semiconductor substrate by using only grinding processes.

A second object of the present invention is to provide a technique capable of achieving a high throughput when reducing the thickness of a semiconductor substrate.

A third object of the present invention is to provide a technique capable of preventing cracking of semiconductor substrates attributable to grinding processes.

A fourth object of the present invention is to provide a technique capable of: establishing a process that does not use chemical liquids, such as hydrofluoric acid and nitric acid thereby making liquid waste disposal unnecessary; reducing the cost by making chemical corrosion-resisting measures for the process equipment unnecessary; and reducing operating cost by making the use of chemical liquids unnecessary.

A fifth object of the present invention is to provide a technique capable of improving the accuracy of the thickness of a semiconductor substrate processed by a thickness reducing process.

According to the present invention, in a semiconductor substrate grinding process, a surface of a semiconductor substrate is ground by applying a rotating grinding wheel onto the surface of the semiconductor substrate which is also rotated. The surface of the substrate is finished by a process that brings a grinding wheel having fine abrasive grains that is rotating at a high rotating speed into contact with the semiconductor substrate. The semiconductor substrate is processed in a stable manner by reducing stress that is induced in the semiconductor substrate during the grinding process. For example, a grinding wheel formed by bonding abrasive grains of grain number #4000 (grain sizes in the range of 2 to 4 μm) is used for finishing the substrate and the grinding wheel is rotated at a high relative rotating speed with respect to the semiconductor substrate to prevent loading of the grinding wheel and to optimize the dressing cycle. The thickness of the semiconductor substrate is continuously measuring to determine the termination of the grinding process.

The present invention provides a semiconductor device manufactured by the above-mentioned method for manufacturing a semiconductor device.

The present invention can also include the use of a flash chemical etching process for finishing the semiconductor substrate before subjecting the semiconductor substrate to a dicing process. An etching allowance in terms of thickness for the chemical etching process can be minimized without raising concern that the semiconductor substrate may break. The semiconductor substrate can be finished by flash etching which can be performed in a simplified way and for a short time. The various advantages of the semiconductor substrate grinding process of the present invention are still maintained even with the limited use of the flash chemical etching process in combination with the semiconductor substrate grinding process.

These and other objects, features and advantages of the present invention will become more apparent in view of the following detailed description of the preferred embodiments in conjunction with the drawings.

BRIEF DESCRIPTION OF THE DRAWINGS

FIG. 2 is a table comparatively illustrating conditions for the grinding method according to a preferred embodiment of the present invention and in comparative examples.

DESCRIPTION OF THE PREFERRED EMBODIMENTS

Preferred embodiments of the present invention will be described hereinafter with reference to the accompanying drawings.

Figure 1:
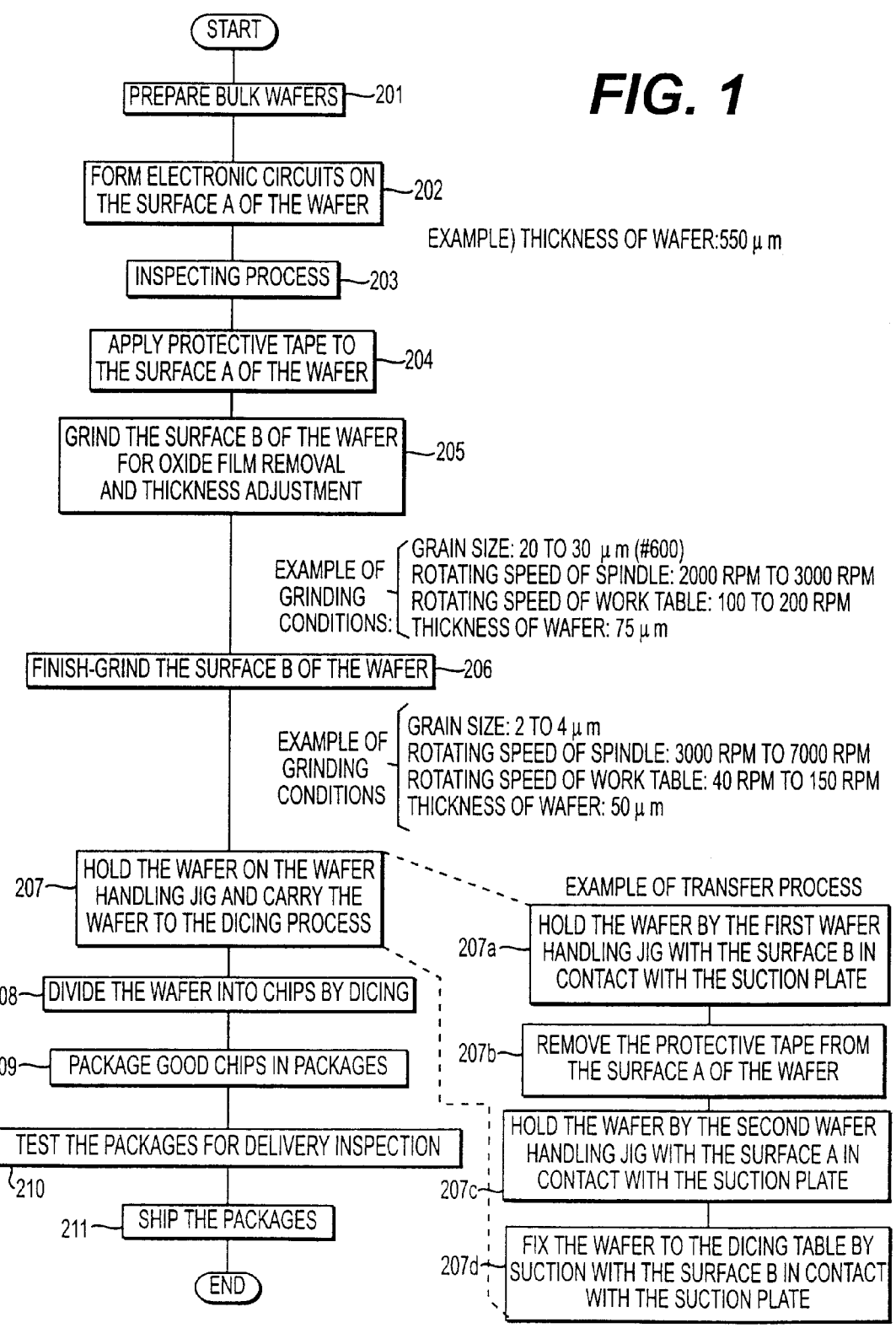
FIG. 1 is a flow chart showing processes of a grinding method and a method for manufacturing a semiconductor device according to a preferred embodiment of the present invention.

FIG. 1 is a flow chart showing processes of a grinding method and a method for manufacturing a semiconductor device according to a preferred embodiment of the present invention, and FIG. 2 is a table comparatively illustrating conditions for the grinding method according to a preferred embodiment of the present invention and in comparative examples.

Figure 3:
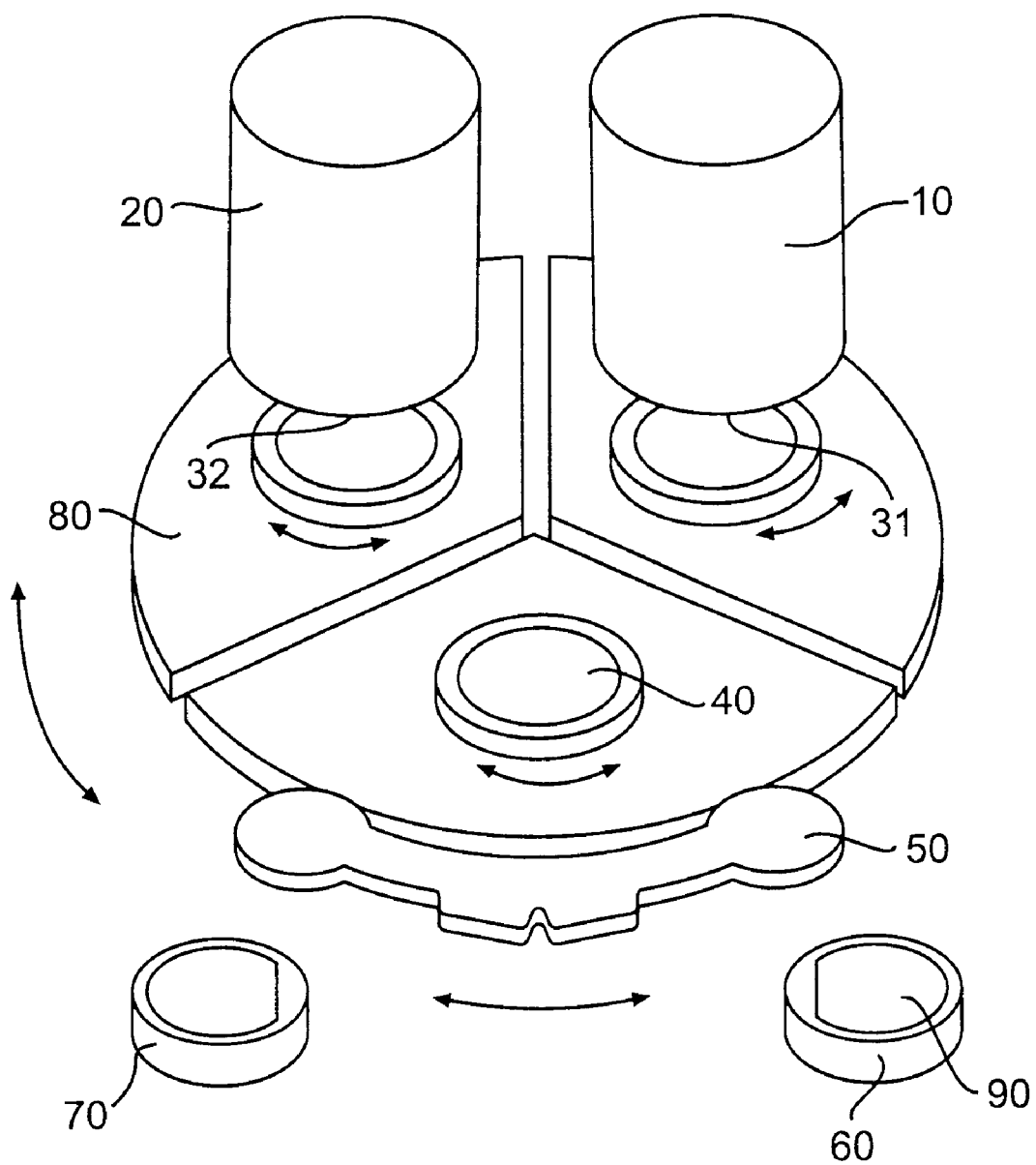
FIG. 3 is a perspective view of a grinding machine for carrying out the grinding method according to a preferred embodiment of the present invention.
Figure 4:
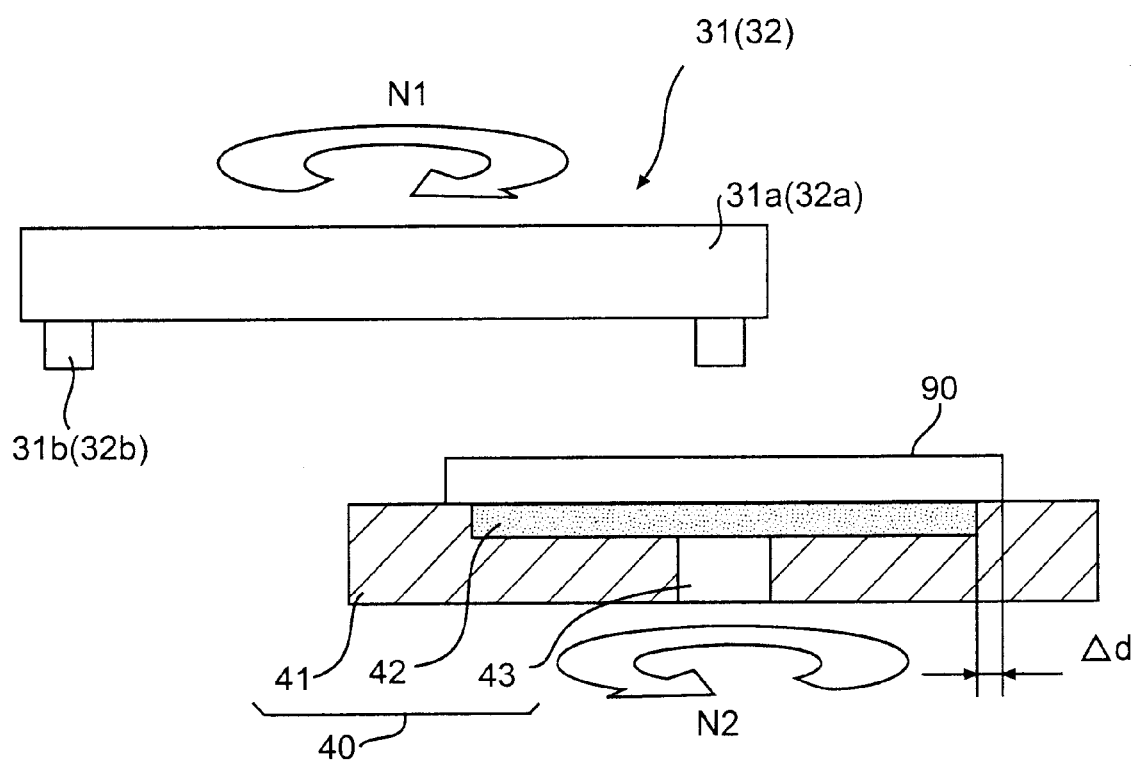
FIG. 4 is a side view of a portion of the grinding machine.
Figure 5:
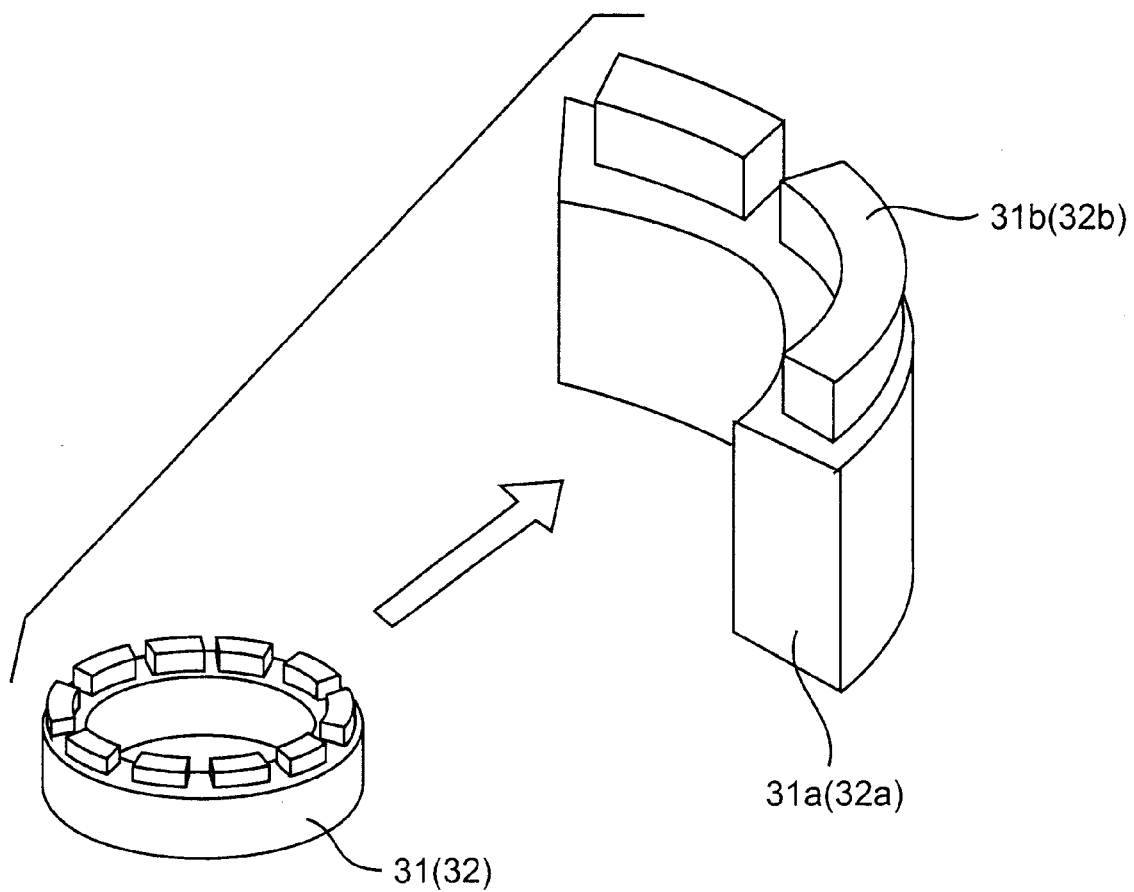
FIG. 5 is a perspective view of a portion of the grinding machine.
Figure 6:
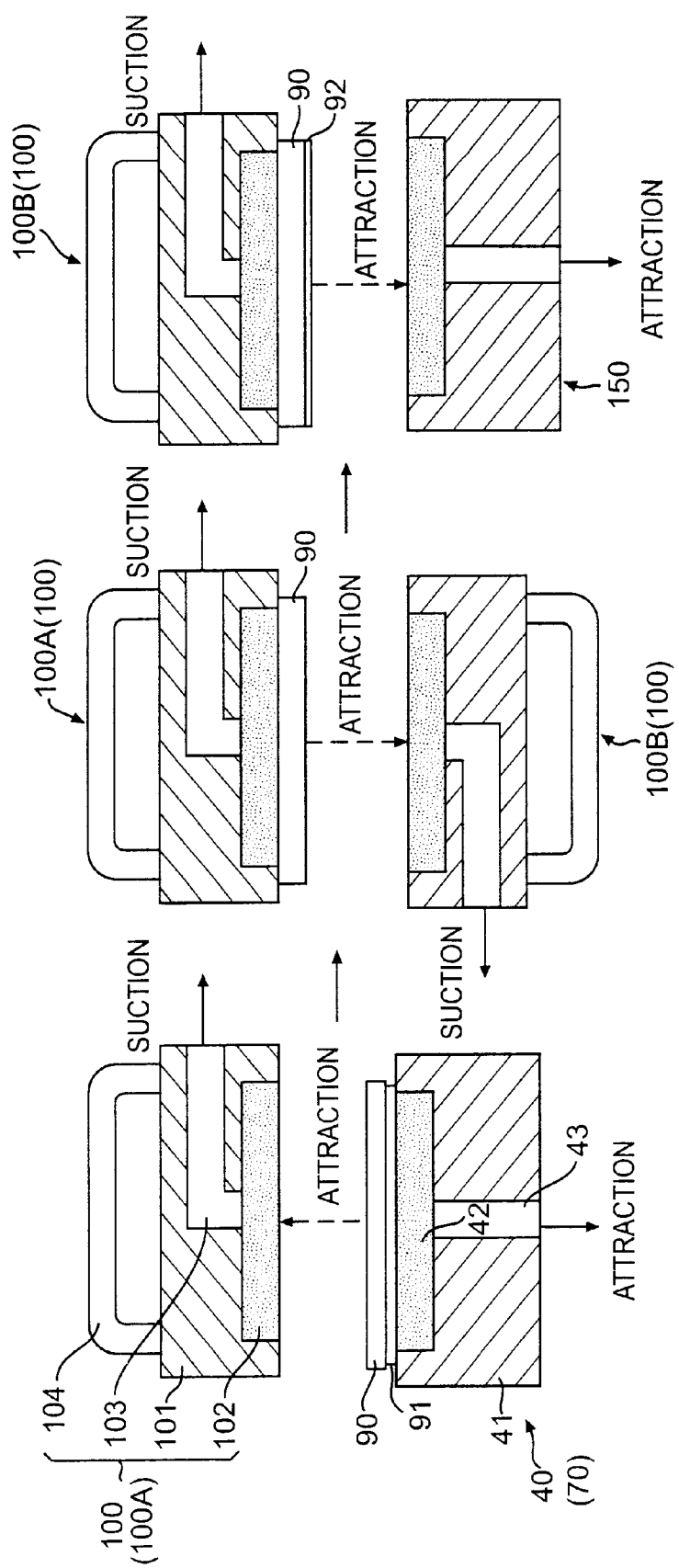
FIG. 6 is a sectional view illustrating the functions of a jig used in a preferred embodiment of the present invention.

FIG. 3 is a perspective view of a grinding machine for carrying out the grinding method according to a preferred embodiment of the present invention, FIG. 4 is a side view of a portion of the grinding machine, FIG. 5 is a perspective view of a portion of the grinding machine, and FIG. 6 is a sectional view illustrating the functions of a jig used in a preferred embodiment of the present invention.

The grinding machine used in the preferred embodiment will be described with reference to FIGS. 3, 4 and 5.

The grinding machine includes a rough grinding spindle 10 as first spindle, a finish grinding spindle 20 as second spindle, a first grinding wheel 31 held on the rough grinding spindle 10, a second grinding wheel 32 held on the finish grinding spindle 20, a plurality of work tables 40 for holding semiconductor substrates (wafers) 90 by suction, an indexing table 80 capable of supporting the plurality of work tables 40 thereon and of locating each work table 40 sequentially at positions respectively corresponding to the rough grinding spindle 10, the finish grinding spindle 20 and a wafer delivery position, a setting table 60 for holding unprocessed wafers, a suction hand 50 which transfers an unprocessed wafer 90 from the setting table 60 to the indexing table 80 and transfers a processed wafer from the indexing table 80 to a delivery table 70. Operating conditions including rotating direction, rotating speed and axial movement respectively for the rough grinding spindle 10 and the finish grinding spindle 20 are independently determined and controlled.

These components of the grinding machine are controlled by a control system not shown in FIGS. 2 and 3, which includes a computer. The ratios between the rotating speeds of the rough grinding spindle 10, the finish grinding spindle 20 and the work tables 40 are set by the control system, and the management of the thickness of the finished wafer 90 by a thickness measuring device is controlled by the control system.

Thickness measuring devices are disposed in combination with the rough grinding spindle 10 and the finish grinding spindle 20, respectively. The thickness measuring devices are capable of measuring the variation of the respective thickness of the wafers 90 which are subjected to grinding by the grinding wheels 31 and 32 held by the rough grinding spindle 10 and the finish grinding spindle 20, respectively, to a submicron accuracy by using laser interference, for example.

As shown in FIG. 4, each work table 40 includes a table body 41 enabled to be rotated in an optional direction at an optional rotating speed by a motor, not shown, or the like, and a flat suction plate 42 of a porous ceramic material, or the like, mounted on the upper surface of the table body 41 for supporting a wafer 90 thereon. The table body 41 is provided with a suction passage 43 connected to an external vacuum pump, or the like, not shown, which in turn communicates with the back side of the suction plate 42 to create a partial vacuum in the suction plate 42.

The suction plate 42 of the work table 40 has a diameter such that the radius of the suction plate 42 is smaller than that of the wafer 90 by a small value Δd of, for example, 0.1 mm or below. The wafer 90 is held securely on the work table 40 by uniform suction with substantially the entire surface of the wafer 90 kept in contact with the suction plate 42.

The first grinding wheel 31 is an in-feed peripheral segment grinding wheel. The first grinding wheel 31 has a base 31a to be held on the rough grinding spindle 10 and a plurality of segmental grinding stones 31b fixedly arranged in a teeth like form in a peripheral region of an end surface of the base 31a.

The segmental grinding stones 31b of the first grinding wheel 31 are, for example, vitrified bonded grinding stones of abrasive grains having grain sizes in the range of 20 to 60 $\mu$m. As an example of operating conditions of the grinding machine, the rotating speed of the rough grinding spindle 10 (spindle rate) in a first direction (e.g. clockwise) is predetermined in the range of 2,000 rpm to 3,000 rpm, the rotating speed of the work table 40 in a second direction which is the opposite direction from the first direction (e.g. counterclockwise) is predetermined in the range of 100 to 200 rpm, and the moving speed of the rough grinding spindle 10 is predetermined in the range of 3 to 8 $\mu$m/s by the control system.

The second grinding wheel 32 is an in-feed peripheral segment grinding wheel. The second grinding wheel 32 has a base 32a to be held on the finish grinding spindle 20 and a plurality of segmental grinding stones 32b fixedly arranged in a teeth like form in a peripheral region of an end surface of the base 32a.

The segmental grinding stones 32b of the second grinding wheel 32 are, for example, resinoid grinding stones of abrasive grains having grain sizes in the range of 2 to 4 $\mu$m (grain number #4000). As an example of operating conditions of the grinding machine, the rotating speed of the finish grinding spindle 20 (spindle rate) in the first direction (e.g. clockwise) is set in the range of 3,000 rpm to 7,000 rpm (e.g. peripheral speed is in the range of 1,850 m/min to 4,550 m/min), the rotating speed of the work table 40 in the second direction (e.g. counterclockwise) is set in the range of 40 to 150 rpm, and the moving speed of the finish grinding spindle 20 is set in the range of 0.3 to 0.8 $\mu$m/s by the control system.

A grinding method and a method for manufacturing a semiconductor device according to a preferred embodiment of the present invention will be described hereinafter.

Description will be made of a grinding process for grinding 550 $\mu$m thick, 5 inch diameter wafers 90 not provided with any electronic circuits thereon (hereinafter referred to as "mirror wafers") by two grinding steps, i.e., a thickness adjusting grinding step (a rough grinding step) and a finish grinding step, to a thickness of 50 $\mu$m. Subsequently, a grinding process for wafers 90 provided with electronic circuits (hereinafter referred to as "circuit-bearing wafers") and conditions to achieve predetermined effects with circuit-bearing wafers 90 will be described.

A 550 $\mu$m thick, 5 inch diameter mirror wafer 90 is ground to a thickness in the range of 70 to 75 $\mu$m with the first grinding wheel 31 held on the rough grinding spindle 10 and provided with vitrified bonded grinding stones of #600 in grain number (grain sizes in the range of 20 to 30 $\mu$m) as the segmental grinding stones 31b. The rough grinding spindle 10 is rotated in the first direction at a rotating of 3,000 rpm, the work table 40 is rotated in the second direction at a rotating speed in the range of 100 to 200 rpm, and the rough grinding spindle 10 is moved in a direction parallel to the thickness of the mirror wafer 90 at a rate in the range of 3 to 8 $\mu$m/s. Subsequently, the mirror wafer 90 is ground to a thickness of 50 $\mu$m with the second grinding wheel 32 held on the finish grinding spindle 20 and provided with resinoid grinding stones of #4000 in grain number (grain sizes in the range of 2 to 4 $\mu$m) as the segmental grinding stones 32b. The finish grinding spindle 20 is rotated in the first direction at a rotating speed of 6,000 rpm (peripheral speed is 3,900 m/min), the work table 40 is rotated at a rotating speed of 150 rpm, and the finish grinding spindle 20 is directed in the direction parallel to the thickness of the mirror wafer 90 at a rate in the range of 0.3 to 0.8 $\mu$m/s. The foregoing process conditions will be referred to as grinding conditions A.

A 550 $\mu$m thick, 5 inch diameter mirror wafer 90 is ground to a thickness in the range of 70 to 75 $\mu$m with the first grinding wheel 31 held on the rough grinding spindle 10 and provided with vitrified bonded grinding stones of #600 in grain number (grain sizes in the range of 20 to 30 $\mu$m) as the segmental grinding stones 31b. The rough grinding spindle 10 is rotated at a rotating speed of 3,000 rpm, the work table 40 is rotated at a rotating speed in the range of 100 to 200 rpm, and the rough grinding spindle 10 is applied onto the mirror wafer 90 at a rate in the range of 3 to 8 $\mu$m/s. Subsequently, the mirror wafer 90 is ground to a thickness of 50 $\mu$m with the second grinding wheel 32 held on the finish grinding spindle 20 and provided with resinoid grinding stones of #4000 in grain number (grain sizes in the range of 2 to 4 $\mu$m) as the segmental grinding stones 32b. The finish grinding spindle 20 is rotated at a rotating speed of 6,000 rpm (peripheral speed is 3,900 m/min), the work table 40 is rotated at a rotating speed of 40 rpm, and the finish grinding spindle 20 is applied onto the mirror wafer 90 at a rate in the range of 0.3 to 0.8 $\mu$m/s. The foregoing process conditions will be referred to as grinding conditions B.

Grinding times necessary for grinding the mirror wafer 90 by grinding processes conforming to the grinding conditions A and B will be estimated. In the thickness adjusting grinding step using the rough grinding spindle 10, a maximum grinding time is 160 seconds ($\approx$(550−70)/3). In the finish grinding step using the finish grinding spindle 20, a maximum grinding time is 84 seconds ($\approx$(75−50)/0.3). Therefore, the 550 $\mu$m thick mirror wafer 90 can be ground to a 50 $\mu$m thick mirror wafer 90 in about 4 minutes by the grinding process conforming to either the grinding conditions A or B. The condition of the finished surface and the deflective strength of the mirror wafer 90 ground by the grinding processes of the preferred embodiment are by no means inferior to those of mirror wafers finished by chemical etching which needs a processing time of 30 min or more in the above-mentioned reference technology.

Grinding stones for grinding processes conforming to the grinding conditions A and B for the preferred embodiment, a protective tape 91 for protecting the mirror wafer 90, and a method of chucking the mirror wafer 90 by suction will be described hereinafter.

As mentioned above, the grinding machine is provided with the rough grinding spindle 10, i.e., the first spindle, and the finish grinding spindle 20, i.e., the second spindle. The grinding wheel 31 (32) held on the rough grinding spindle 10 (the finish grinding spindle 20) is an in-feed peripheral segment grinding wheel and has a base 31a (32a) of 209 mm in diameter held on the rough grinding spindle 10 (the finish grinding spindle 20), and the plurality of segmental grinding stones 31b (32b) of about 3 mm in width, about 20 mm in length and about 4 mm in height arranged like teeth in a peripheral region of an end surface of the base 31a (32a), for example.

The protective tape 91 for protecting the mirror wafer 90 is a UV-peelable tape and has a base tape of a thickness in the range of 100 to 150 μm and an adhesive layer of a thickness in the range of 30 to 50 μm. The total thickness of the protective tape 91 is in the range of 130 to 200 μm. The protective tape 91 is adhered uniformly to the mirror wafer 90 by pressing the protective tape 91 to the mirror wafer 90 with a roller in order that neither bubbles nor foreign materials such as dust exists between the mirror wafer 90 and the protective tape 91.

When grinding the mirror wafer 90, the mirror wafer 90 is put on the work table 40 with the protective tape 91 adhered to the lower surface of the mirror wafer 90 in contact with the suction plate 42 composed of a porous ceramic material or the like embedded in the surface of the table body 41 of the work table 40, and the mirror wafer 90 is held in place by suction.

The suction plate 42 has a suction surface, i.e., a surface in which suction pores are distributed, formed in a size such that the suction plate 42 attracts only the 5 inch diameter mirror wafer 90. As mentioned above, the mirror wafer 90 is positioned on the suction plate 42 so that the circumference thereof extends beyond the circumference of the suction plate 42 by within 0.1 mm. Thus, a peripheral portion of the mirror wafer 90 is held securely by suction on the work table 40 during the grinding process.

The grinding conditions A and B according to the preferred embodiment and comparative examples (grinding conditions) 1 and 2 according to the reference technology are shown comparatively in FIG. 2.

The mirror wafer 90 ground by the foregoing grinding processes were divided into 3.3 mm square chips by a dicing process and the deflective strengths (relative values) were compared. The mirror wafer 90 ground by the grinding processes of the preferred embodiment were attached to a dicing tape 92, and were subjected to a dicing process under the same conditions, and the mechanical characteristics were evaluated. When removing the protective tape 91 from the 50 μm thick mirror wafer 90 ground by the finish grinding process and attaching the mirror wafer 90 to the dicing tape 92, the mirror wafer 90 was not handled in a naked state; the mirror wafer 90 held in a horizontal position by a wafer handling jig 100 capable of holding the wafer by suction was handled to prevent the cracking of the wafer during transportation from one to the next process.

FIG. 6 is a sectional view illustrating the functions of the wafer handling jig. The wafer handling jig 100 has a jig body 101 provided with a suction passage 103 opening into a recess formed in one surface of the jig body 101, a suction plate 102 composed of such as a porous ceramic material embedded in the recess formed in the surface of the jig body 101, and a handle 104 attached to the other surface of the jig body 101. The suction passage 103 is connected to a vacuum source which is not shown in FIG. 6. When transferring the wafer from the grinding process to the dicing process, two wafer handling jigs 100, i.e., a first wafer handling jig 100A and a second wafer handling jig 100B, are used.

Referring to FIG. 6, the mirror wafer 90 ground by grinding steps and mounted on the work table 40 located at the delivery position or on the delivery table 70 as shown the left part of FIG. 6 is held by the first wafer handling jig 100A with the ground surface thereof attracted to the suction plate 102 by suction while maintained in a horizontal position.

And then the protective tape 91 is removed from the mirror wafer 90. The second wafer handling jig 100B is placed opposite to the mirror wafer 90 held by the first wafer handling jig 100A. The mirror wafer 90 is transferred from the first wafer handling jig 100A to the second wafer handling jig 100B so that the surface of the mirror wafer 90 exposed by removing the protective tape 91 therefrom, i.e., a surface in which circuits are formed, is in contact with the suction plate 102 of the second wafer handling jig 100B by making the suction of the first wafer handling jig 100A ineffective and making the suction of the second wafer handling jig 100B effective (shown at the middle drawing in FIG. 6).

The ground surface of the mirror wafer 90 held in a horizontal position by the second wafer handling jig 100B is exposed. A dicing tape 92 is adhered to the exposed ground surface of the mirror wafer 90. Then, the mirror wafer 90 held in a horizontal position by suction on the second wafer handling jig 100B is transferred from the second wafer handling jig 100B to a dicing table 150. The suction of the second wafer handling jig 100B is made ineffective after the mirror wafer 90 has been held securely by suction on the dicing table 150 with the dicing tape 92 in contact with the support surface of the dicing table 92 (the right drawing in FIG. 6).

Figure 7:
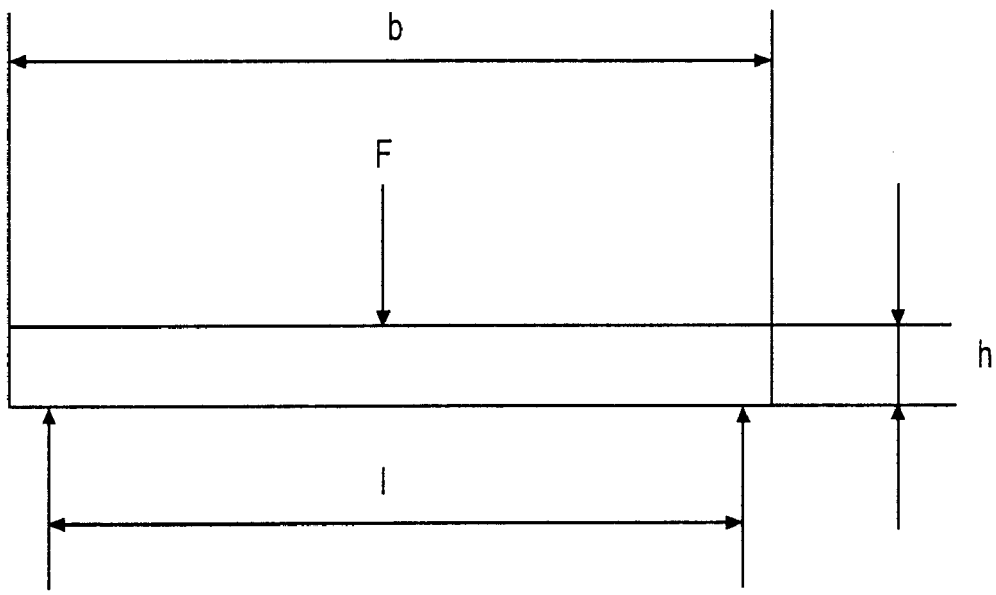
FIG. 7 is a conceptional view which aids in explaining a method for measuring a deflective strength of an object to be subjected to the grinding process.
Figure 8:
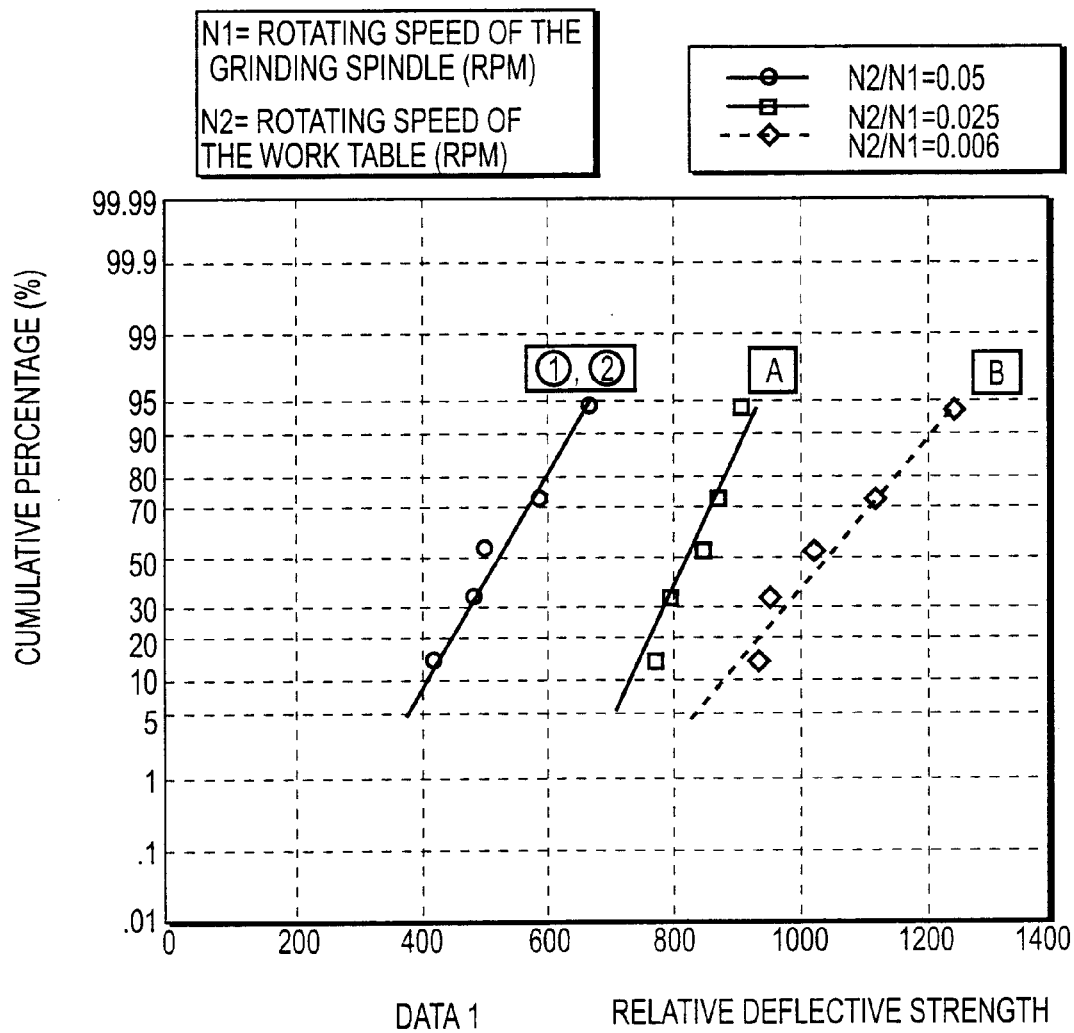
FIG. 8 is a graph for comparing the effects of the grinding method according to a preferred embodiment of the present invention and in comparative examples.

Deflective strength was measured by using a deflective strength evaluation formula shown in FIG. 7. That is, force was added at the center of a surface of the mirror wafer 90 supported by two fulcrums and the force (breaking force F) was measured when the mirror wafer 90 was broken. And then the deflective strength was calculated using the measured breaking force F. The measured results are shown in FIG. 8. FIG. 8 shows the relation between cumulative percentage and relative deflective strength for various N2/N1 ratios. Values calculated by using the deflective strength evaluation formula shown in FIG. 7 are shown in relative values. The values shown in FIG. 8 are measured ones obtained by measurement in which the deflective strength was measured by supporting the mirror wafer 90 with the surface ground by grinding steps facing down. In FIG. 8, a curve (1), (2) indicates measured data on silicon wafers (chips) ground by grinding processes conforming to the comparative grinding conditions 1 and 2, and curves A and B indicate measured data on mirror wafers ground by grinding processes conforming to the grinding conditions A and B according to the preferred embodiment.

Figure 10:
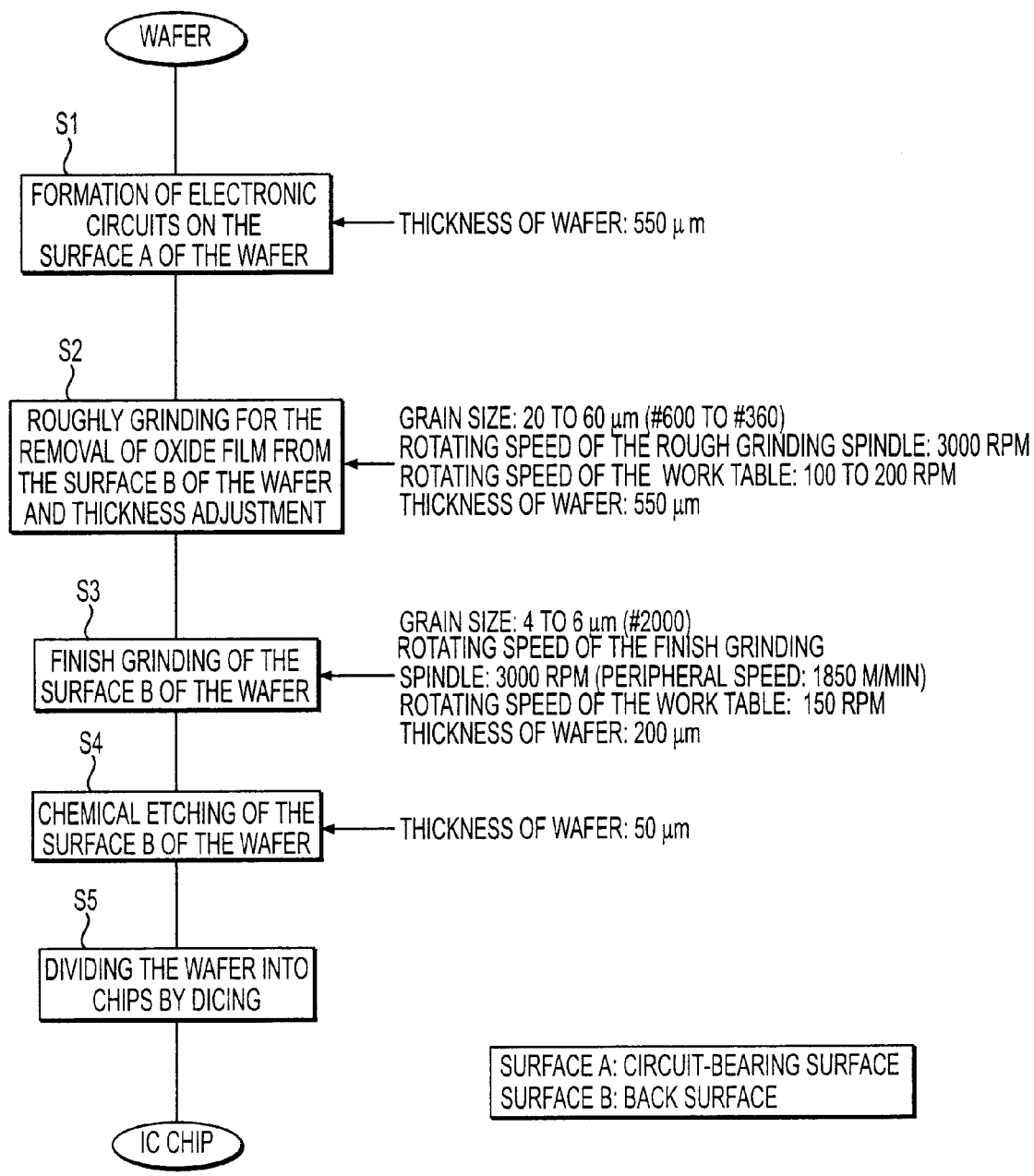
FIG. 10 is a flow chart illustrating processes of a grinding method and a method for manufacturing a semiconductor device in reference technology that is useful in the inventor's analysis of existing problems and causes of the problems, which analysis is a part of the present invention.

As obvious from FIG. 8, the deflective strengths of the silicon wafers ground by the grinding processes conforming to the comparative grinding conditions, in which the finishing grinding stones are #2000 resinoid grinding stones, the rotating speed N1 of the grinding wheel is 3,000 rpm (which is equal to peripheral speed of 1850 m/min), the rotating speed N2 of the wafer is 150 rpm, and the ratio N2/N1 is 0.05, are lower than those of the mirror wafers ground by the grinding processes conforming to the grinding conditions B, in which the ratio N2/N1 is 0.006, and is half the deflective strengths of the mirror wafer. Further, the mean value of deflective strength of wafers in the comparative example finished by the chemical etching process included in the semiconductor device manufacturing method shown in FIG. 10 is 1120, and the deflective strength of the mirror wafer ground by the grinding process conforming to the grinding conditions A and B of the preferred embodiment is 1090, which is nearly equal to the mean value of deflective strength of the wafers in the comparative example.

Further, the inventors measured deflective strengths of mirror wafers ground by the finish grinding process according to the conditions of the preferred embodiment other than conditions A and B, in which the finishing grinding stones are #4000 resinoid grinding stones 32b, the rotating speed N1 of the finish grinding spindle 20 is in the range of 3,000 rpm to 7,000 rpm, the rotating speed N2 of the mirror wafer 90 is in the range of 40 rpm to 150 rpm, and the ratio N2/N1 is in the range of 0.006 to 0.025, and confirmed that the measured deflective strengths are the same of those of the mirror wafer ground by the grinding process conforming to the grinding conditions A and B.

A manufacturing process for wafers provided with electronic circuits (hereinafter referred to as "circuit-bearing wafers") will be described with reference to FIG. 1.

A wafer, i.e., a bulk wafer, having a mirror-finished surface, i.e., a surface A, is produced by predetermined wafer manufacturing processes in step 201. A plurality of electronic circuits which compose a plurality of semiconductor devices are formed simultaneously in a regularly periodic pattern on the surface A of the bulk wafer by a wafer process using known photolithographic techniques, for example, in step 202.

The wafer formed with electronic circuits (circuit-bearing wafer 90) is subjected to an inspecting process in step 203, in which the plurality of semiconductor devices formed on the circuit-bearing wafer 90 are tested by probing to distinguish good semiconductor devices from bad ones. A protective tape 91 is applied to the surface A of the circuit-bearing wafer 90 in step 204.

The circuit-bearing wafer 90 is put on the work table 40 with the protective tape 91 applied to surface A of the circuit-bearing wafer 90 in contact with the suction plate 42 composed of a porous ceramic material or the like embedded in the surface of the table body 41 of the work table 40, and the circuit-bearing wafer 90 is held in place by suction.

The circuit-bearing wafer 90 is subjected to a thickness adjusting grinding process (a rough grinding process) for oxide film removable and thickness adjustment in step 205. The circuit-bearing wafer 90 which has a 550 μm thick and a 5 inch diameter is ground to a thickness in the range of 70 to 75 μm with the first grinding wheel 31 held on the rough grinding spindle 10 and provided with vitrified bonded grinding stones of #600 in grain number (grain sizes in the range of 20 to 30 μm) as the segmental grinding stones 31b. For example, the rough grinding spindle 10 is rotated in the first direction at a rotating speed in the range of 2,000 rpm to 3,000 rpm, the work table 40 is rotated in the second direction at a rotating speed in the range of 100 to 200 rpm, and the rough grinding spindle 10 is applied onto the mirror wafer 90 at a rate in the range of 3 to 8 μm/s.

Then, the circuit-bearing wafer 90 is subjected to a finish-grinding process in step 206. The circuit-bearing wafer 90 is ground to a thickness of, for example, 50 μm with the second grinding wheel 32 held on the finish grinding spindle 20 and provided with resinoid grinding stones of #4000 in grain number (grain sizes in the range of 2 to 4 μm) as the segmental grinding stones 32b. The finish grinding spindle 20 is rotated in the first direction at a rotating speed in the range of 3,000 rpm to 7,000 rpm, the work table 40 is rotated in the second direction at a rotating speed in the range of 40 rpm to 150 rpm, and the finish grinding spindle 20 is directed in the direction parallel to the thickness of the mirror wafer 90 at a rate in the range of 0.3 to 0.8 μm/s. For, example, the finish grinding spindle 20 is rotated at a rotating speed of 6,000 rpm, the work table 40 is rotated at a rotating speed of 150 rpm, and the finish grinding spindle 20 is directed in the direction parallel to the thickness of the mirror wafer 90 at a rate in the range of 0.3 to 0.8 μm/s (the grinding condition A). Alternatively, the finish grinding spindle 20 is rotated at a rotating speed of 6,000 rpm, the work table 40 is rotated at a rotating speed of 40 rpm, and the finish grinding spindle 20 is applied onto the circuit-bearing wafer 90 at a rate in the range of 0.3 to 0.8 μm/s (the grinding condition B).

Subsequently, step 207 including steps 207a to 207d for handling the wafers as illustrated in FIG. 6 is executed in step 207 to remove the protective tape 91 and to attach a dicing tape 92 to the circuit-bearing wafer 90 and to transfer the wafer 90 to the dicing process. That is, when removing the protective tape 91 from the 50 μm thick circuit-bearing wafer 90 ground by the finish grinding process and adhering the circuit-bearing wafer 90 to the dicing tape 92, the circuit-bearing wafer 90 is not handled in a naked state. The circuit-bearing wafer 90, held in a horizontal position by the wafer handling jig 100, is handled to prevent the cracking of the wafer during transportation from one to the next process.

The circuit-bearing wafer 90 is adhered to the dicing tape 92 and is subjected to a dicing process in step 208. The circuit-bearing wafer 90 is divided into individual 3.3 mm square chips (semiconductor devices) by the dicing process.

The good semiconductor devices selected by the inspecting process in step 203 are subjected to a packaging process by desired sealing and packaging techniques in step 209. When necessary, packages fabricated by packaging the chips are tested before shipping in step 210, and the acceptable packages are shipped in step 211.

In the above dicing process in step 208, the inventors measured the deflective strengths (relative values) and confirmed that the relative deflective strength of circuit-bearing wafers 90 ground by the grinding process conforming to the above-mentioned grinding condition is substantially equal to that of a wafer processed by the chemical etching process included in the reference semiconductor device manufacturing method shown in FIG. 10.

Figure 9:
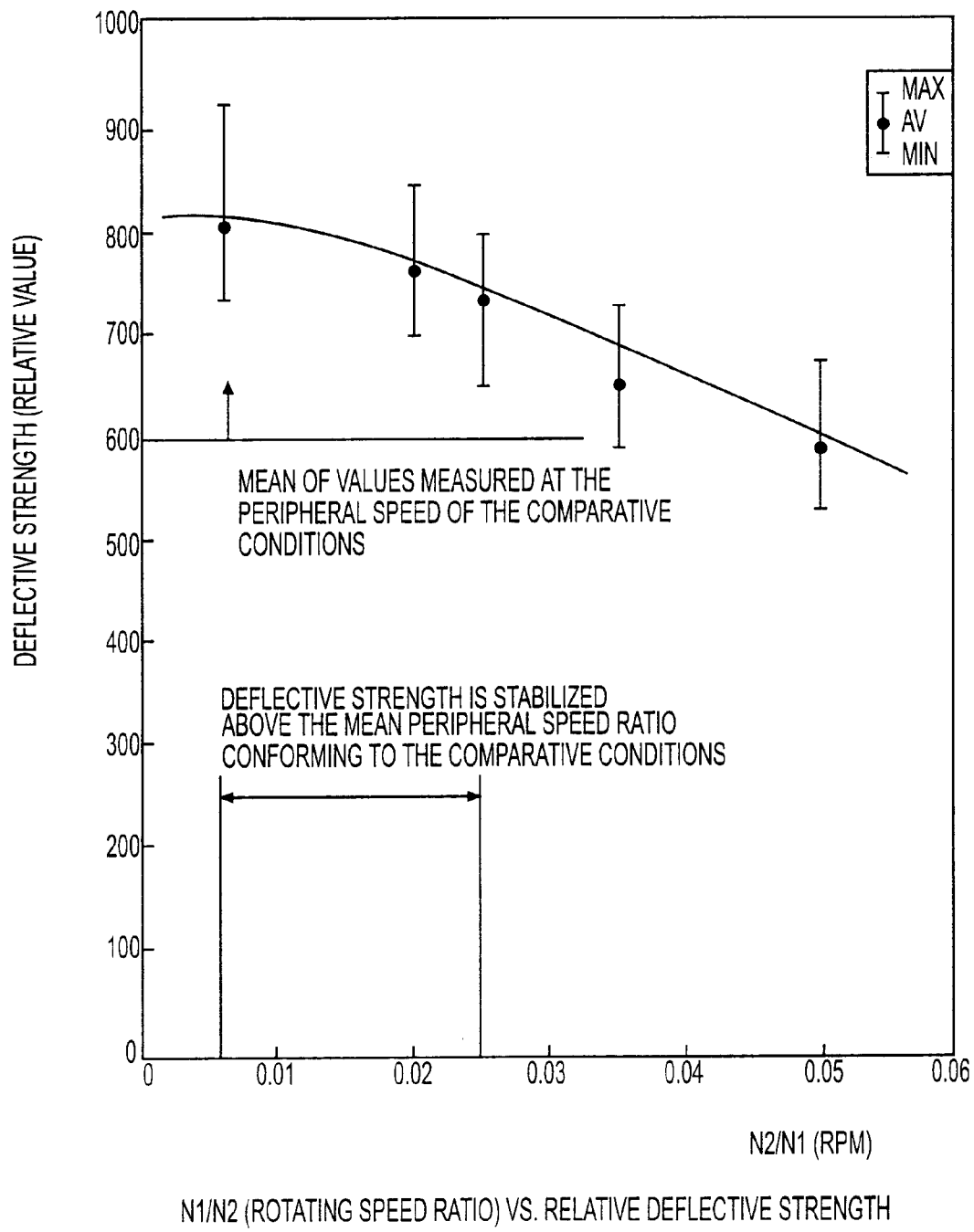
FIG. 9 is graph illustrating the effects of the grinding method according to a preferred embodiment of the present invention.

FIG. 9 shows the dependence of deflective strength (relative value) on the ratio N2/N1.

Referring to FIG. 9, deflective strength (relative values) of the circuit-bearing wafers ground by the grinding process of the preferred embodiment which correspond to each ratio N2/N1 in the range of 0 to 0.05 are higher than the mean value of deflective strength of wafers ground by the grinding processes conforming to the comparative grinding conditions, in which the finishing grinding stones are #2000 resinoid grinding stones, the rotating speed N1 of the grinding wheel is 3,000 rpm, the rotating speed N2 of the wafer is 150 rpm, and the ratio N2/N1 is 0.05.

As to the ratio N2/N1, according to the preferred embodiment, the range of 0.006 to 0.025 as the ratio N2/N1 is more suitable. That is, the ratio N2/N1 of 0.025 is acquired from (1) a process condition that stabilizes deflective strength and (2) a process condition that ensures that the deflective strength of the wafer processed is not lower than the mean value of the deflective strengths of wafers ground by grinding processes conforming to the comparative grinding conditions 1 and 2. And the ratio N2/N1 of 0.006 is determined from a process condition for an economically and practically feasible grinding process in view of the cost of equipment which increases when the rigidity of the equipment is enhanced to prevent the deflection of the finish grinding spindle 20 (second spindle) resulting from the rotation of the finish grinding spindle 20 at a high rotating speed.

The thickness of the circuit-bearing wafers ground by the grinding process conforming to the above-mentioned grinding conditions were in the range of 50±5 μm. That is, the circuit-bearing wafers has a thickness accuracy within 5 μm. In some cases, the range of differences between the thickness of the wafers in the comparative example finished by chemical etching is two to four times that of differences between the thickness of the circuit-bearing wafers ground by the grinding processes in the preferred embodiment, because the thickness of the circuit-bearing wafer can continuously be measured during the grinding process and the termination of the grinding process can properly be determined, while it is difficult to determine the termination of the chemical etching process and to control the thickness of the wafer. Further, The electronic circuits formed on the circuit-bearing wafers ground by the grinding process in the preferred embodiment functions normally.

According to the preferred embodiment, the appearance of the ground surfaces and physical properties of the circuit-bearing wafers ground by the grinding processes conforming to the above-mentioned grinding conditions according to the preferred embodiment as well as their deflective strengths are definitely different from those of the wafers ground by the grinding processes conforming to the comparative grinding conditions 1 and 2.

(1) The surfaces of the circuit-bearing wafers ground by the grinding processes conforming to the grinding conditions A and B according to the preferred embodiment are excellent in luster and toolmarks are scarcely formed therein. The order of superiority in effect in forming lustrous surfaces is Grinding conditions A>Grinding conditions B>>Comparative grinding conditions 2>Comparative grinding conditions 1. (Correspondence of the appearance of ground surfaces with data on surface roughness could not be determined by a laser optical surface roughness tester in the Rmax range of 0.448 to 0.553 and in the Ra range of 0.12 to 0.15.)

(2) An average of intensity outputs obtained by Raman analysis were in the range of 500 to 600 for the surfaces ground by the grinding processes conforming to the above-mentioned grinding conditions and were on the order of 300 for the surfaces ground by the grinding processes conforming to the comparative grinding conditions 1.

Surfaces finished by chemical etching have intensity outputs as determined by Raman analysis which are on the order of 1500. It is presumed that the surfaces finished by chemical etching has high intensity outputs because scratches formed in the surfaces are removed by chemical etching and crystal planes are exposed completely. Therefore, it is inferred through Raman analysis that the surfaces having intensity outputs greater than the intensity outputs on the order of 300 for the surfaces ground by the grinding processes conforming to the comparative grinding conditions 1 and smaller than the intensity outputs on the order of 1500 of the surfaces finished by chemical etching are formed by the grinding processes conforming to the above-mentioned grinding conditions according to the preferred embodiment.

The above-mentioned circuit-bearing wafer 90 is provided with bumps of 15 μm in height. Depending on the height of bumps formed on circuit-bearing wafers and the configuration of the electronic circuits formed on the circuit-bearing wafers, a grinding stones of abrasive grains of #600 or #2000 may be used instead of grinding stones of abrasive grains of #360 in the step 205, and the surface may be finished by the step 206 for finish grinding using a grinding stones of abrasive grains of #4000. After the completion of the steps 205 and 206 for the grinding of the surface B of a circuit-bearing wafer, the surface B may be finished by a flash chemical etching process. The grinding process conforming to the grinding conditions of the preferred embodiment is able to grind the circuit-bearing wafer so as to leave an etching allowance which can be etched in several minutes by the chemical etching process without fearing that the circuit-bearing wafer may break because of the thickness reduction or cracks of the circuit-bearing wafer.

According to the preferred embodiment, since the ground thin wafer having reduced strength is handled while maintained in a horizontal position, the breakage of the wafer is prevented and the yield of the semiconductor devices can surely be improved.

Since the thickness of the circuit-bearing wafer 90 is adjusted, the surface of the circuit-bearing wafer 90 is finished satisfactorily only by the grinding processes of the preferred embodiment without requiring chemical etching which requires long periods of time and increases various costs, and the circuit-bearing wafer 90 thus finished has sufficient surface quality and deflective strength, the semiconductor devices are manufactured at a high productivity and at reduced costs.

Since the circuit-bearing wafer 90 can be ground to a thickness on the order of 30 μm while maintaining the foregoing advantages, IC cards and miniature portable information processing apparatus to which thin semiconductor devices (chips) are essential can be realized and produced at low costs.

Since the circuit-bearing wafer 90 is ground in a very small thickness within 50 μm by grinding processes of the preferred embodiment, the semiconductor device (chip) from the circuit-bearing wafer 90 is very thin. Therefore, the efficiency of heat dissipation through the ground surface of the semiconductor device during operations is further improved, the enhancement of the operating speed and the improvement of reliability is achieved at low costs.

As apparent from above description, the following effects are achieved by the preferred embodiment.

(1) Since the surface of the wafer (semiconductor substrate) is finished only by grinding processes without requiring chemical etching, disposal of liquid waste, such as a used etchant, is unnecessary and the process does not cause environmental issues.

(2) The grinding processes for grinding the wafer is carried out at reduced running costs because costs for an etchant and providing the process equipment relating to chemical etching with chemical corrosion-resisting measures are not necessary.

(3) The wafers are ground in a thickness accuracy within ±5 μm, while the thickness accuracy of wafers finished by the chemical etching process in reference technique is ±10 μm. Accordingly, the wafers ground by the grinding process of the preferred embodiment ensure high-quality packaging and connection in the following packaging and connecting processes.

(4) The processing efficiency of grinding is far higher than that of chemical etching. The grinding processes grind the wafers at high productivity, high throughput and low costs.

(5) The grinding processes of the preferred embodiment is capable of finishing the surface of the wafer in a satisfactory quality not only when grinding the wafer in a thickness of 50 μm or below but also when grinding the wafer in a thickness in the range of 100 to 400 μm, and of greatly reducing damage in the ground surface to finish the surface in a high surface quality.

(6) The thin semiconductor device (chip) of 50 μm or below in thickness is used for forming an IC package suitable for use in miniature, lightweight mobile electronic equipment.

(7) The thin semiconductor device (chip) of 50 μm or below in thickness is expected to have an improved ability in dissipating heat from its ground surface.

(8) When the product requires a finishing process using chemical etching, the grinding processes conforming to the grinding conditions of the preferred embodiment is able to grind a wafer so as to provide a small etching allowance, and the surface of the wafer is finished by flash etching, which is far more economically advantageous than the reference techniques.

While the present invention has been described with respect to the preferred embodiments, for the specific advantages thereof, the present invention is not limited in its practical application to that embodiment specifically described herein, and many changes, modifications and variations are contemplated according to the broader aspects of the present invention without departing from the scope and spirit of the present invention.

For example, although the preferred embodiment has been described as applied to grinding the surface of a circuit-bearing wafer after a wafer process, the present invention may be applied to grinding wafers in a bulk wafer manufacturing process before the wafer process.

What is claimed is:

1. A grinding method for grinding a surface of a substrate using a grinding wheel, comprising the steps of:
    rotating the grinding wheel at a rotating speed N1;
    rotating the substrate at a rotating speed N2, wherein a value of N2/N1 is in the range of 0.006 to 0.025;
    grinding the surface of the substrate with the grinding wheel; and
    wherein said step of grinding grinds the surface of the substrate by moving the grinding wheel at a rate in the range of 0.3 to 0.8 μm/s.

2. A method for manufacturing a semiconductor device, comprising the steps of:
    providing a semiconductor substrate including a plurality of semiconductor devices, wherein the semiconductor substrate has a first surface and a second surface which is opposite to the first surface;
    forming circuits from the semiconductor devices in the first surface of the semiconductor substrate;
    grinding the second surface of the semiconductor substrate using at least one grinding wheel, wherein said step of grinding includes steps of:
        rotating the grinding wheel in a first direction at a rotating speed N1,
        rotating the semiconductor substrate in a second direction which is the opposite direction from the first direction at a rotating speed N2, wherein a value of N2/N1 is in the range of 0.006 to 0.025,
        grinding the second surface of the semiconductor substrate with the grinding wheel;
    cutting the semiconductor substrate into individual semiconductor devices; and
    wherein said step of grinding includes a step of applying the grinding wheel onto the second surface of the substrate at a rate in the range of 0.3 to 0.8 μm/s.

3. A method for manufacturing a semiconductor device, comprising the steps of:
    providing a semiconductor substrate including a plurality of semiconductor devices, wherein the semiconductor substrate has a first surface and a second surface which is opposite to the first surface;
    forming circuits from the semiconductor devices in the first surface of the semiconductor substrate;
    grinding the second surface of the semiconductor substrate using at least one grinding wheel, wherein said step of grinding includes steps of:
        rotating the grinding wheel in a first direction at a rotating speed N1,
        rotating the semiconductor substrate in a second direction which is the opposite direction from the first direction at a rotating speed N2, wherein a value of N2/N1 is in the range of 0.006 to 0.025,
        grinding the second surface of the semiconductor substrate with the grinding wheel;
    cutting the semiconductor substrate into individual semiconductor devices;
    wherein said step of grinding includes a step of applying the grinding wheel onto the second surface of the substrate at a rate in the range of 0.3 to 0.8 μm/s; and
    wherein said step of grinding further includes steps of measuring thickness of the semiconductor substrate while the second surface is ground by the grinding wheel, and terminating grinding when the measured thickness is a predetermined thickness.

4. A method for manufacturing a semiconductor device, comprising the steps of:
    providing a semiconductor substrate including a plurality of semiconductor devices, wherein the semiconductor substrate has a first surface and a second surface which is opposite to the first surface;
    forming circuits from the semiconductor devices in the first surface of the semiconductor substrate;
    grinding the second surface of the semiconductor substrate using at least one grinding wheel, wherein said step of grinding includes steps of:
        rotating the grinding wheel in a first direction at a rotating speed N1,
        rotating the semiconductor substrate in a second direction which is the opposite direction from the first direction at a rotating speed N2, wherein a value of N2/N1 is in the range of 0.006 to 0.025,
        grinding the second surface of the semiconductor substrate with the grinding wheel;
    cutting the semiconductor substrate into individual semiconductor devices; and
    wherein the rotating speed N1 is in the range of 3000 rpm to 7000 rpm and the rotating speed N2 is in the range of 40 rpm to 150 rpm.

5. A method for manufacturing a semiconductor device, comprising the steps of:
    (1) providing a semiconductor substrate including a plurality of semiconductor devices, wherein the semiconductor substrate has a first surface and a second surface which is opposite to the first surface;
    (2) forming circuits from the semiconductor devices in the first surface of the semiconductor substrate;
    (3) grinding the second surface of the semiconductor substrate using grinding wheels, wherein said step of grinding includes a first grinding step of grinding the second surface of the semiconductor substrate by a first grinding wheel and a second grinding step of grinding the second surface of the semiconductor substrate by a second grinding wheel, (a) wherein said first grinding step includes steps of:
rotating the first grinding wheel in a first direction at a rotating speed N1,
rotating the semiconductor substrate in a second direction which is the opposite direction from the first direction at a rotating speed N2, and
grinding the second surface of the substrate with the first grinding wheel, and (b) wherein said second grinding step includes steps of:
rotating the second grinding wheel in the first direction at a rotating speed N3,
rotating the semiconductor substrate in the second direction which is the opposite direction from the first direction at a rotating speed N4, wherein a value of N4/N3 is in the range of 0.006 to 0.025, and
grinding the second surface of the substrate with the second grinding wheel;

(4) cutting the semiconductor substrate into individual semiconductor devices; and
wherein said second grinding step grinds the second surface of the semiconductor substrate by directing the second grinding wheel at a rate in the range of 0.3 to 0.8 $\mu$m/s.

6. A grinding method for grinding a surface of a substrate using a grinding wheel, comprising the steps of:
rotating the grinding wheel at a rotating speed N1;
rotating the substrate at a rotating speed N2, wherein a value of N2/N1 is in the range of 0.006 to 0.025;
grinding the surface of the substrate with the grinding wheel; and
wherein the rotating speed N1 is in the range of 3000 rpm to 7000 rpm and the rotating speed N2 is in the range of 40 rpm to 150 rpm.

7. A semiconductor device manufactured by a process comprising the steps of:
providing a semiconductor substrate including a plurality of semiconductor devices, wherein the semiconductor substrate has a first surface and a second surface which is opposite to the first surface;
forming circuits of the semiconductor devices in the first surface of the semiconductor substrate;
grinding the second surface of the semiconductor substrate using at least one grinding wheel, wherein said step of grinding includes steps of:
rotating the grinding wheel in a first direction at a rotating speed N1,
rotating the semiconductor substrate in a second direction which is the opposite direction from the first direction at a rotating speed N2, wherein a value of N2/N1 is in the range of 0.006 to 0.025, and
grinding the second surface of the substrate with the grinding wheel;
cutting the semiconductor substrate into individual semiconductor devices; and
wherein the rotating speed N1 is in the range of 3000 rpm to 7000 rpm and the rotating speed N2 is in the range of 40 rpm to 150 rpm.

8. A method for manufacturing a semiconductor device, comprising the steps of:
(1) providing a semiconductor substrate including a plurality of semiconductor devices, wherein the semiconductor substrate has a first surface and a second surface which is opposite to the first surface;
(2) forming circuits from the semiconductor devices in the first surface of the semiconductor substrate;
(3) grinding the second surface of the semiconductor substrate using grinding wheels, wherein said step of grinding includes a first grinding step of grinding the second surface of the semiconductor substrate by a first grinding wheel and a second grinding step of grinding the second surface of the semiconductor substrate by a second grinding wheel, (a) wherein said first grinding step includes steps of:
rotating the first grinding wheel in a first direction at a rotating speed N1,
rotating the semiconductor substrate in a second direction which is the opposite direction from the first direction at a rotating speed N2, and
grinding the second surface of the substrate with the first grinding wheel, and (b) wherein said second grinding step includes steps of:
rotating the second grinding wheel in the first direction at a rotating speed N3,
rotating the semiconductor substrate in the second direction which is the opposite direction from the first direction at a rotating speed N4, wherein a value of N4/N3 is in the range of 0.006 to 0.025, and
grinding the second surface of the substrate with the second grinding wheel;

(4) cutting the semiconductor substrate into individual semiconductor devices; and
wherein the rotating speed N3 is in the range of 3000 rpm to 7000 rpm and the rotating speed N4 is in the range of 40 rpm to 150 rpm.

* * * * *